United States Patent [19]
Higuchi

[11] Patent Number: 4,823,323
[45] Date of Patent: Apr. 18, 1989

[54] ELECTRONIC APPARATUS WITH REPLACEABLE POWER SOURCE

[75] Inventor: Masayuki Higuchi, Ueno, Japan

[73] Assignee: Sharp Kabushiki Kaisha, Osaka, Japan

[21] Appl. No.: 889,493

[22] Filed: Jun. 25, 1986

[30] Foreign Application Priority Data

Jul. 29, 1985 [JP] Japan .................. 60-169168

[51] Int. Cl.[4] .................. G11C 11/40; H02J 9/06
[52] U.S. Cl. .................. 365/228; 365/229
[58] Field of Search .................. 365/228, 229, 189; 371/66

[56] References Cited

U.S. PATENT DOCUMENTS

| | | | |
|---|---|---|---|
| 3,859,638 | 1/1975 | Hume, Jr. .................. | 365/229 |
| 4,461,003 | 7/1984 | Tamaki .................. | 371/66 |
| 4,672,585 | 6/1987 | Nollet .................. | 365/228 |
| 4,715,016 | 12/1987 | Lamiaux et al. .................. | 365/228 X |
| 4,730,121 | 3/1988 | Lee et al. .................. | 365/229 X |

FOREIGN PATENT DOCUMENTS

| | | |
|---|---|---|
| 224986 | 7/1985 | Fed. Rep. of Germany . |
| 58-54417 | 3/1983 | Japan .................. 365/228 |
| 59-38988 | 3/1984 | Japan .................. 365/229 |

OTHER PUBLICATIONS

"Spannungsuberwachungsschaltkreis", Elektronik-Applikation, eee, Issue 5, Mar. 13, 1984, pp. 53–56, 58.

Primary Examiner—Stuart N. Hecker
Assistant Examiner—Alyssa H. Bowler
Attorney, Agent, or Firm—Birch, Stewart, Kolasch & Birch

[57] ABSTRACT

An electronic apparatus comprises a random access memory, a central processing unit which supplies a write/read signal to the random access memory to control the input/output of data of the random access memory, a replaceable power source for feeding the central processing unit, and a switch for isolating the random access memory from the write or read signal output from the central processing unit when the power source is replaced.

13 Claims, 3 Drawing Sheets

FIG. 5
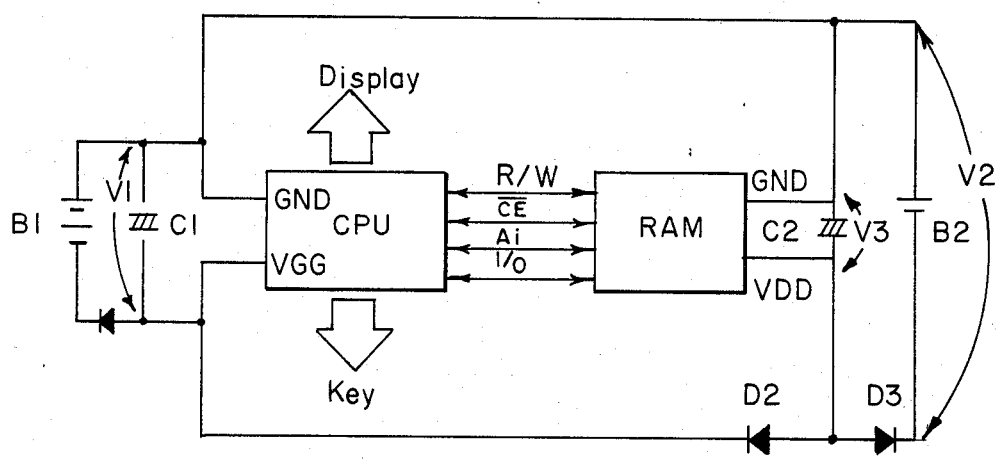
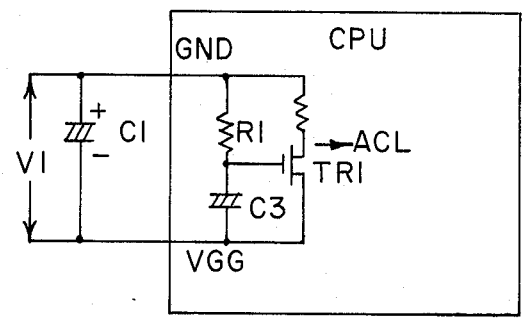
FIG. 6

ELECTRONIC APPARATUS WITH REPLACEABLE POWER SOURCE

BACKGROUND OF THE INVENTION

The present invention relates to an electronic apparatus equipped for protecting the memory content against destruction when the power source is replaced with a battery.

Due to the recent development of a lower price and larger capacity C-MOS RAM, an increased number of digital electronic apparatus have been provided with memory-backup auxiliary batteries for long-term preservation of the memory data as well as with main power supply batteries for feeding the main circuits including CPU's. In the conventional electronic apparatus, however, possible failure in designating the initial address of the CPU on replacing the main power supply battery can cause abnormal operation of the CPU, resulting in memory data destruction.

SUMMARY OF THE INVENTION

To solve the above disadvantage, an object of the present invention is to provide an electronic apparatus equipped for protecting the main content against destruction when the power source is replaced with a battery.

Another object of the present invention is to provide an electronic apparatus which provides a control function for shutting off the write/read signal output to the memory when replacing the power source thereby protecting the memory content against destruction during the power source replacement.

Other objects and further scope of applicability of the present invention will become apparent from the detailed description given hereinafter. It should be understood, however, that the detailed description and specific examples, while indicating preferred embodiments of the inventions, are given by way of illustration only; various changes and modifications within the spirit and scope of the invention will become apparent to those skilled in the art from this detailed description.

To achieve the above objects, according to an embodiment of the present invention, an electronic apparatus having a memory and a replaceable power source comprises control means that shuts off the supply of the write/read signal to the memory when replacing the power source.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 5 and 6 are circuit diagrams of an electronic apparatus for comparison with the electronic apparatus of the present invention.

DETAILED DESCRIPTION OF THE INVENTION

The construction of the present invention is described below with reference to the drawings.

Figure 1:
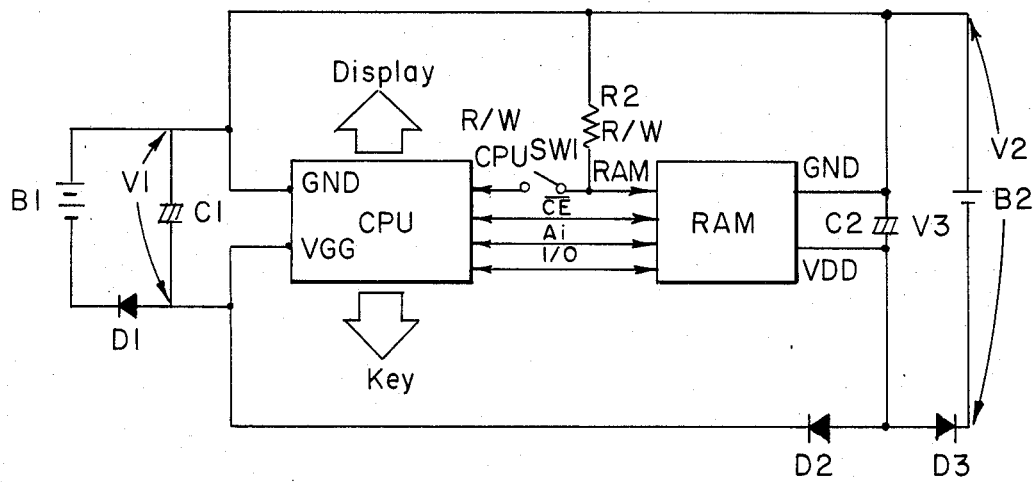
FIGS. 1 and 2 are circuit diagrams of one embodiment of an electronic apparatus of the present invention.

FIG. 1 is a circuit diagram of one embodiment of the electronic apparatus of the present invention. In this figure, CPU is a central processing unit and RAM is a random access memory.

The CPU is fed by a CPU-driving main power supply battery $B_1$ and the RAM is backed up by an auxiliary battery $B_2$ to protect the memory content.

A diode $D_1$ is provided to prevent an inverse connection of the battery $B_1$. A diode $D_2$ supplied the voltage of the battery $B_1$ to the RAM and doide $D_3$ supplies the voltage of the auxiliary battery $B_2$ to the RAM.

Prior to the detailed description of the embodiment of the present invention, an example of the electronic apparatus in which a digital circuit shown in FIG. 5 contains a CPU having a circuit shown in FIG. 6 is described as follows.

In this example, when a capacitor $C_1$ between GND and $V_{GG}$ of the CPU has an extremely larger capacity than a capacitor $C_3$ of a $V_1$ voltage variation detector circuit, or when replacement of the battery $B_1$ causes chattering, thereby hampering the ACL signal generation or causing an ACL signal with a narrow width if generated, the initial address of the CPU may not be designated, resulting in abnormal operation of the CPU.

Consequently, the CPU generates a R(read) or W(write) signal and a $\overline{CE}$ signal, thus destroying the memory content of the RAM. Namely, with the circuits shown in FIGS. 5 and 6, protection of the memory content of the RAM is incomplete when replacing the battery.

The embodiment of the electronic apparatus of the present invention has solved the above problem.

As shown in FIG. 1, $V_1$ is the voltage applied to the CPU, $V_2$ is the voltage of the auxiliary battery $B_2$, and $V_3$, is the voltage applied to the RAM. If the voltage setting for the batteries $B_1$ and $B_2$ is such that $V_1$ is larger than $V_2$ as long as the battery $B_1$ is effective, then the battery $B_1$ keeps supplying voltage to the RAM through the diodes $D_1$ and $D_2$. As the battery $B_1$ is consumed with age, $V_1$ becomes smaller than $V_2$. Then, voltage is supplied to the RAM from the battery $B_2$ through the diode $D_3$.

The CPU contains a circuit which prevents generation of $\overline{CE}$ signal, the access signal from the CPU to the RAM, when $V_1$ is smaller than $V_2$. Accordingly, while $V_1$ is smaller than $V_2$, current consumed by the RAM is a stand-by current (about 1 $\mu A$ or less for a C-MOS RAM). If the battery $B_1$ has been used up, then, the battery $B_6$ can supply voltage to the RAM for a long time, ensuring protection of the RAM content.

Figure 2:
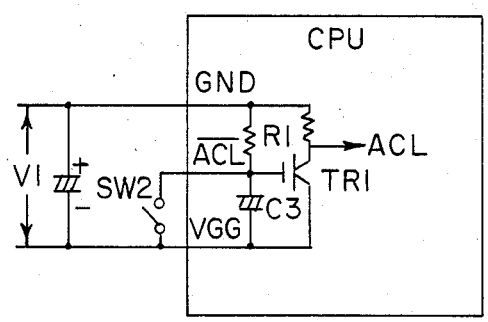

The battery $B_1$ should be replaced when it has been used up. In order to prevent destruction of the RAM content caused by the abnormal operation of the CPU which can occur when replacing the battery $B_1$, the circuit shown in FIG. 2 is built in the CPU, enabling the CPU to start from the initial address after the battery $B_1$ is replaced. The circuit detects variations in the voltage $V_1$ when the battery $B_1$ is replaced, so that the initial address of the CPU is designated by an ACL signal.

The electronic apparatus of the present invention is provided with a RAM content protective switch $SW_1$. The switch $SW_1$ isolates the RAM from the R/W signal that may be generated by the CPU due to its abnormal operation resulting from the replacement of the main power supply battery $B_1$.

Furthermore, the electronic apparatus of the present invention is also provided with a switch $SW_2$ which is operable from outside the apparatus, as shown in FIG. 2. When the ACL signal is not generated properly from the $V_1$ voltage variation detector circuit that comprises a resistor $R_1$, a capacitor $C_3$ and a transistor $TR_1$ in the CPU, the switch $SW_2$ causes the ACL signal to be normally generated for initialization of the CPU.

According to the present invention, the switches $SW_1$ ans $SW_2$ are closed or opened by sliding the battery lid in replacing the battery $B_1$.

The states of the switches $SW_1$ and $SW_2$ in replacing the battery $B_1$ are as follows:

① When the lid of the battery $B_1$ is removed: The switch $SW_1$ is opened so that R/W RAM which inputs the R/W signal for the RAM is kept at the GND level.

② When the battery $B_1$ is replaced: The voltage $V_1$ voltage variation detector circuit does not generate the ACL signal properly, causing which would cause an abnormal operation of the CPU.

③ When the lid of the battery $B_1$ is mounted: After the switch $SW_2$ is closed, which initializes the CPU, the switch $SW_1$ is closed to connect R/W CPU with R/W RAM.

Thus, if the CPU operation is abnormal without initialization when the battery $B_1$ is replaced, then the RAM is isolated from the R/W signal by the switch $SW_1$ until the CPU is initialized by the switch $SW_2$, whereby the memory content of the RAM is protected against destruction.

Now, the battery lid which opens or closes the switches $SW_1$ and $SW_2$ is described below.

Figure 3:
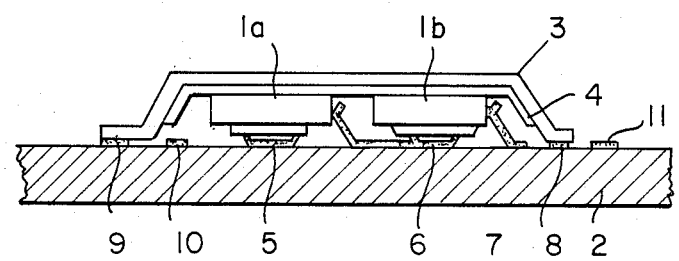
FIGS. 3 and 4 are construction drawings of the electronic apparatus of the present invention.
Figure 4:
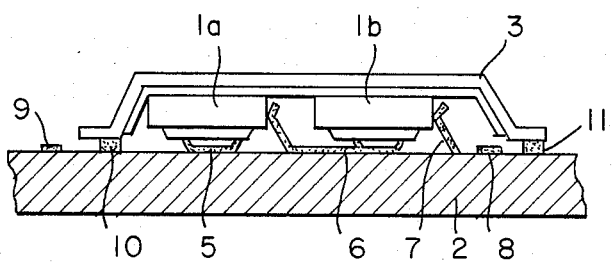

The construction of the battery lid of the main power supply battery $B_1$ is shown in FIGS. 3 and 4 in which the main power supply battery $B_1$ is indicated by 1a and 1b.

The battery cells 1a and 1b are set on a substrate 2 provided on the apparatus main body by the metallic battery lid 3 which covers the substrate 3.

Insulating tape 4 is bonded to the inner side of the battery lid 3. The battery cells 1a and 1b come in or out of contact with terminals (described below) on the substrate 2 when the battery lid 3 slides.

On the substrate 2, the negative terminal 5 of the cell 1a, a terminal 6 for connection between the positive terminal of the cell 1a and the negative terminal of the cell 1b, the positive terminal 7 of the cell 1b, the $\overline{ACL}$ signal (FIG. 2) terminal 8, the $V_{GG}$ (FIG. 2) terminal 9, the R/W CPU (FIG. 1) terminal 10, and the R/W RAM (FIG. 1) terminal 11 are formed.

FIG. 3 shows the state when the battery lid 3 is mounted after battery replacement. FIG. 4 shows the state when the battery lid 3 is slid open for battery replacement.

Modified construction of the battery lid is possible without departing from the spirit of the present invention, if interruption of the R/W signal is effected by removing the battery lid. Specifically, if only the battery lid is provided with a switch function for the R/W signal line so that R/W signal is shut off when the lid is removed and the R/W signal is connected when the lid is mounted after replacement of the battery, and another switch function for initializing the CPU is provided, then the battery lid has the same effect as that of the present invention.

According to the present invention, as described from above, the electronic apparatus having a memory and a replaceable power source comprises control means which isolates the memory from the write or read signal while the power source is replaced, thereby ensuring protection of the memory content when the power source is replaced. In addition, a memory protective function works automatically when the power source is replaced. Accordingly, special measures are not necessary for protecting the memory content, which is convenient in operating the electronic apparatus.

While only certain embodiments of the present invention have been described, it will be apparent to those skilled in the art that various changes and modifications may be made therein without departing from the spirit and scope of the present invention as claimed.

What is claimed is:

1. An electronic apparatus comprising: memory means for storing data;
    control means for controlling input and output of data in and from said memory means by supplying write and read signals to the memory means;
    replaceable power supply means for supplying power to said control means and to said memory means; and
    memory protect means for detecting the removal of said replaceable power supply means and, in response thereto, disabling the supply of the write and read signals output by said control means to said memory means during the replacement of said replaceable power supply means, said memory protect means including first switch means responsive to an operation necessary for removing the replaceable power supply means to disconnect the write and read signals from said memory means and second switch means for initializing and operating said control means to address the memory means from an initial address when reconnecting the write and read signals in response to a condition after replacement of said replaceable power supply means, thereby preventing data of said memory means from being destroyed after replacing said replaceable power supply means.

2. The electronic apparatus of claim 1, wherein said control means is a CPU (Central Processing Unit).

3. The electronic apparatus of claim 1, wherein said memory means is a RAM (Random Access Memory).

4. The electronic apparatus of claim 1, further comprising:
    an auxiliary power supply means provided for supplying power to said memory means.

5. The electronic apparatus of claim 4, further comprising:
    voltage compare means for comparing the voltage applied from said replaceable power supply means with the voltage of said auxiliary power supply means; and
    power select means for selecting between the replaceable power supply means and the auxiliary power supply means for supplying power to the memory means in response to the output from said voltage compare means of the control means.

6. The electronic apparatus of claim 5, wherein the power select means selects said replaceable power supply means when the voltage applied to the control means from the replaceable power supply means is larger than the voltage of the auxiliary power supply means determined by the voltage compare means.

7. The electronic apparatus of claim 5, wherein the power select means selects said auxiliary power supply means when the voltage applied to the control means from the replaceable power supply means is smaller than the voltage of the auxiliary power supply means determined by the voltage compare means.

8. The electronic apparatus of claim 7, further comprising:
means for preventing an access signal from being transmitted from said control means to said memory means when the auxiliary power supply means is selected by the power select means.

9. The electronic apparatus of claim 1, wherein said memory means consumes a normal current when said replaceable power supply means supplies the memory means, and if said first switch means disconnects the write and read signals, then the auxiliary power supply means supplies a standby current to the memory means, thereby protecting the memory content of the memory means.

10. The electronic apparatus of claim 1, wherein said second switch means includes voltage variation detector means for detecting variations in the power supplied to said control means after said first switch means responds to the replacement of the replaceable power supply means, and the second switch means designates an initial address of the control means by an ACL signal determined by the output from said voltage variation detector means.

11. The electronic apparatus of claim 10, wherein said second switch means initializes said control means by enabling a normal generation of an ACL signal in response to an operator after said condition after replacement of the replaceable power supply means.

12. The apparatus of claim 1 further comprising:
a housing enclosing said apparatus;
a compartment receiving said replaceable power supply means and being provided with a removable cover;
said operation necessary to removing said replaceable power supply means being the removal of said cover;
said first switch means sensing the removal of said cover.

13. The apparatus of claim 12 wherein said first switch means is a first switch which is open only when said cover is removed.

* * * * *